(12) United States Patent
Shin

(10) Patent No.: US 6,955,957 B2
(45) Date of Patent: Oct. 18, 2005

(54) METHOD OF FORMING A FLOATING GATE IN A FLASH MEMORY DEVICE

(75) Inventor: Hyeon Sang Shin, Ichon-Shi (KR)

(73) Assignee: Hynix Semiconductor Inc., Ichon-Shi (KR)

(*) Notice: Subject to any disclaimer, the term of this patent is extended or adjusted under 35 U.S.C. 154(b) by 6 days.

(21) Appl. No.: 10/616,508

(22) Filed: Jul. 10, 2003

(65) Prior Publication Data
US 2004/0152251 A1 Aug. 5, 2004

(30) Foreign Application Priority Data
Dec. 23, 2002 (KR) ................. 10-2002-0082547

(51) Int. Cl.[7] ............... H01L 21/337; H01L 21/8238; H01L 21/8242; H01L 21/336; H01L 21/331; H01L 21/76

(52) U.S. Cl. ............. 438/196; 438/207; 438/218; 438/219; 438/225; 438/248; 438/294; 438/295; 438/296; 438/297; 438/318; 438/353; 438/355; 438/362; 438/359; 438/391; 438/404; 438/439

(58) Field of Search ................ 438/225, 297, 438/362, 439, 593, 257, 201, 211, 424, 426, 438/196, 207, 294, 295, 296, 218, 219, 248, 438/318, 353, 355, 359, 391, 404

(56) References Cited

U.S. PATENT DOCUMENTS

| 6,107,143 | A | * | 8/2000 | Park et al. ............... 438/296 |
| 6,197,637 | B1 | * | 3/2001 | Hsu et al. ............... 438/257 |
| 6,221,715 | B1 | * | 4/2001 | Chen ............... 438/257 |
| 6,222,225 | B1 | * | 4/2001 | Nakamura et al. ............. 257/315 |
| 6,323,085 | B1 | * | 11/2001 | Sandhu et al. ............. 438/257 |
| 6,355,539 | B1 | * | 3/2002 | Lai et al. ............. 438/424 |
| 6,391,722 | B1 | * | 5/2002 | Koh ............. 438/264 |
| 6,620,740 | B2 | * | 9/2003 | Thakur ............. 438/771 |
| 6,649,472 | B1 | * | 11/2003 | Hsieh ............. 438/257 |
| 6,654,793 | B1 | * | 11/2003 | Wollrath et al. ............. 709/217 |
| 6,743,675 | B2 | * | 6/2004 | Ding ............. 438/257 |
| 6,791,142 | B2 | * | 9/2004 | Tseng ............. 257/316 |
| 6,830,969 | B2 | * | 12/2004 | Woo ............. 438/218 |
| 2002/0072170 | A1 | * | 6/2002 | Lam ............. 438/239 |
| 2002/0094641 | A1 | * | 7/2002 | Shin et al. ............. 438/257 |
| 2003/0068860 | A1 | * | 4/2003 | Rabkin et al. ............. 438/257 |
| 2003/0119257 | A1 | * | 6/2003 | Dong et al. ............. 438/257 |
| 2004/0152260 | A1 | * | 8/2004 | Rabkin et al. ............. 438/257 |

* cited by examiner

FOREIGN PATENT DOCUMENTS

JP 2001284556 10/2001

*Primary Examiner*—Carl Whitehead, Jr.
*Assistant Examiner*—James M. Mitchell
(74) *Attorney, Agent, or Firm*—Mayer, Brown, Rowe & Maw LLP

(57) ABSTRACT

Disclosed is a method of forming the floating gate in the flash memory device. After the first polysilicon film is deposited on the semiconductor substrate, the trench is formed on the first polysilicon film with the pad nitride film not deposited. The HDP oxide film is then deposited to bury the trench. Next, the HDP oxide film is etched to define a portion where the second polysilicon film will be deposited in advance. The second polysilicon film is then deposited on the entire top surface, thus forming the floating gate. Thus, it is possible to completely remove a moat and an affect on EFH (effective field oxide height), solve a wafer stress by simplified process and a nitride film, and effectively improve the coupling ratio of the flash memory device.

3 Claims, 3 Drawing Sheets

METHOD OF FORMING A FLOATING GATE IN A FLASH MEMORY DEVICE

BACKGROUND OF THE INVENTION

1. Field of the Invention

The present invention relates to a method of forming a floating gate in a flash memory device, and more particularly, to a method of forming a floating gate using SASTI (self aligned shallow trench isolation) in the flash memory device.

2. Background of the Related Art

In NAND data flash memory devices currently being developed, a gate oxide thinning problem has been solved using SASTI (self aligned shallow trench isolation). However, there is still a difficulty in controlling a moat generated due to the height of a first polysilicon film and EFH (effective field oxide height). Furthermore, a slope is generated in the ISO (ISOlation) etch process, i.e., in trench formation process. Accordingly, it has influence on the profile of a subsequent HDP (high density plasma) oxide film, which causes to generate the slope even in the profile of the HDP oxide film. This slope of the HDP oxide film causes a bridge problem by residue of the first polysilicon film in the floating gate etch process. In addition, in a conventional STI process using a pad nitride film, there are problems that the pad nitride film remains in a large pattern and stress is applied to the wafer.

SUMMARY OF THE INVENTION

Accordingly, the present invention is contrived to substantially obviate one or more problems due to limitations and disadvantages of the related art, and an object of the present invention is to remove a moat generating at the top corner of a HDP oxide film, i.e., an isolation film and an effect for EFH (effective field oxide height) and solve a bridge problem by residue remaining in a floating gate etch process due to a slope of the isolation film.

Another object of the present invention is to simplify the process, solve a wafer stress due to a pad nitride film and improve the coupling ratio of the flash memory.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a floating gate in a flash memory device according to the present invention is characterized in that it comprises the steps of forming a gate oxide film on a semiconductor substrate, depositing a first polysilicon film on the gate oxide film, etching potions of the first polysilicon film, the gate oxide film and the semiconductor substrate to form a trench, depositing an oxide film for an isolation film on the entire top surface so that the trench is gap-filled and then implementing a polishing process, implementing an etch process using a dry etch method to etch the oxide film for the isolation film, thus forming the oxide film for the isolation film the top of which has a protrusion of a vertical nipple shape, and depositing a second polysilicon film on the entire top surface and then implementing a polishing process to form a floating gate that is divided around the oxide film for the isolation film and consists of the first and second polysilicon film.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
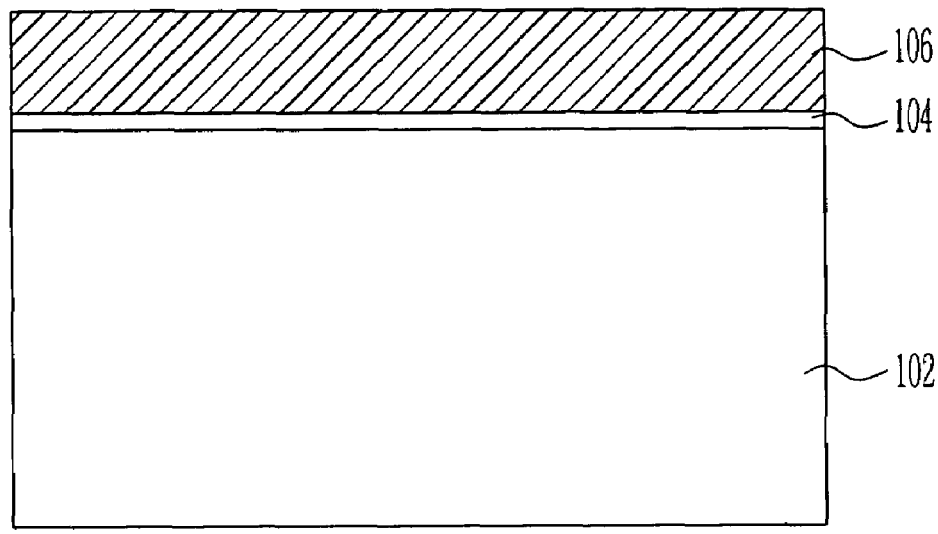
FIG. 1~FIG. 6 are cross-sectional views of flash memory devices for explaining a method of forming a floating gate in the memory device according to a preferred embodiment of the present invention.

Reference will now be made in detail to the preferred embodiments of the present invention, examples of which are illustrated in the accompanying drawings.

FIG. 1~FIG. 6 are cross-sectional views of flash memory devices for explaining a method of forming a floating gate in the memory device according to a preferred embodiment of the present invention. Like reference numerals shown in FIG. 1~FIG. 6 are used to identify the same or similar parts.

Referring to FIG. 1, a semiconductor substrate 102 the top surface of which is cleaned through a pre-treatment cleaning process is provided. At this time, it is preferred that the pre-treatment cleaning process is implemented using DHF (diluted HF; HF solution diluted with $H_2O$ at the ratio of 50:1) and SC-1 (solution where $NH_4OH/H_2O_2/H_2O$ solution is mixed at a given ratio), or BOE (buffered oxide etchant; a mixed solution [1:4~1:7] of HF and $NH_4F$ where $H_2O$ is diluted at the ratio of 100:1 or 300:1) and SC-1.

Next, in order to prevent damage of the top surface of the semiconductor substrate 102 in a subsequent well ion implantation process, a screen oxide film (not shown) may be deposited on the entire structure. At this time, in case where the screen oxide film is deposited, it is preferred that the screen oxide film is formed in thickness of 30~100 Å by implementing an oxidization process using a dry oxidization mode or a wet oxidization mode at a temperature of 750~1100° C.

A well ion implantation process is then implemented for the entire structure to form a P-well region or a N-well region (not shown) in a portion of the semiconductor substrate 102. At this time, the P-well is formed by implanting boron ions and the N-well is formed by implanting phosphorus or arsenic ions.

Thereafter, a gate oxide film 104 is formed. At this time, the process for forming the gate oxide film 104 may be implemented the oxidization process using the dry oxidization mode or the wet oxidization mode. In the above, the oxidization process may be performed with the screen oxide film deposited in FIG. 1 not removed, or after the screen oxide film is removed by a cleaning process. Meanwhile, in FIG. 1, after the screen oxide film is sufficiently thickly formed, the screen oxide film can be used as the gate oxide film 104 without additional oxidization process. In this case, however, it is preferred that a portion of the screen oxide film that is damaged in the well ion implantation process is removed.

Then, a first polysilicon film 106 is deposited on the gate oxide film 104. At this time, the polysilicon film 106 is formed using an undoped silicon film or a doped silicon film. For example, in case where the polysilicon film 106 is formed using the undoped silicon film, a $SiH_4$ gas or a $Si_2H_6$ gas is utilized. Meanwhile, in case where the polysilicon film 106 is formed using the doped silicon film, it is formed using the same method to those of the undoped silicon film, wherein the polysilicon film 106 is formed by introducing $PH_3$ to the $SiH_4$ gas or the $Si_2H_6$ gas.

Figure 2:
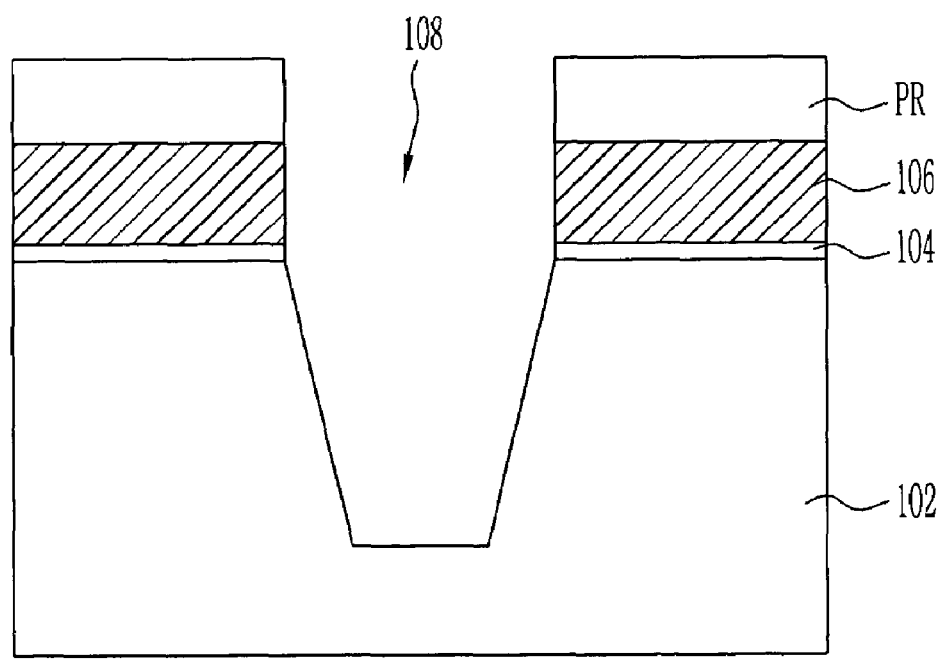

By reference to FIG. 2, a photoresist is coated on the entire structure. Exposure and development processes using a photo mask are then implemented to form a photoresist pattern PR.

Next, an etch process using the photoresist pattern PR is implemented to etch potions of the first polysilicon film 106, the gate oxide film 104 and the semiconductor substrate 102, thereby forming a trench 108. Thereby, an active region and a field region (i.e., region where the trench is formed) are defined. At this time, a profile of an inner sidewall in which the first polysilicon film 106 and the gate oxide film 104 are patterned has a vertical profile with no slope by adequately controlling the etch process.

Figure 3:
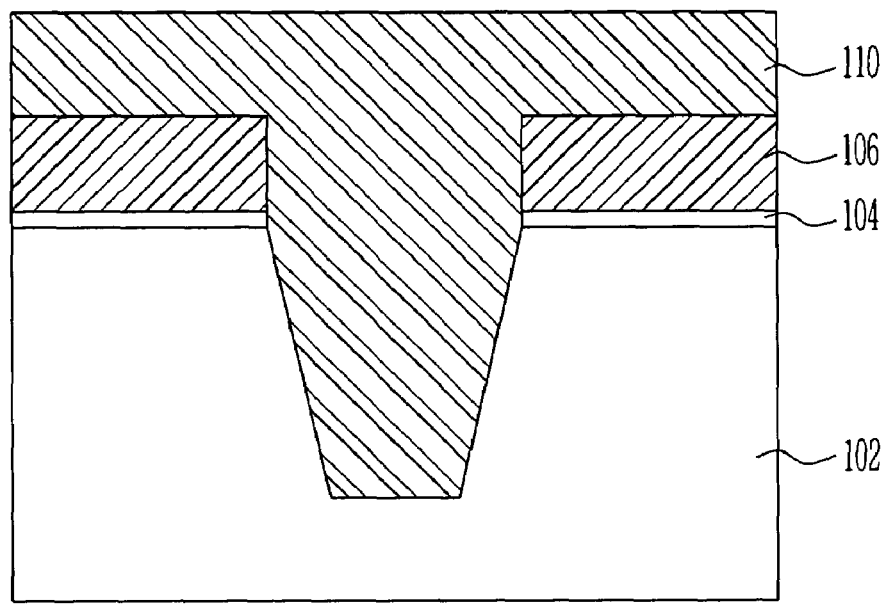

With reference to FIG. 3, a HDP oxide film 110 for an isolation film is deposited on the entire structure. It is preferred that the HDP oxide film 110 is gap-filled so that void is not generated within the trench 108. A polishing process, for instance a CMP (chemical mechanical polishing) process or an ACE (advanced chemical etching) process is then implemented to partially polish the HDP oxide film 110. At this time, the HDP oxide film 110 is polished to remain on the first polysilicon film 106.

Figure 4:
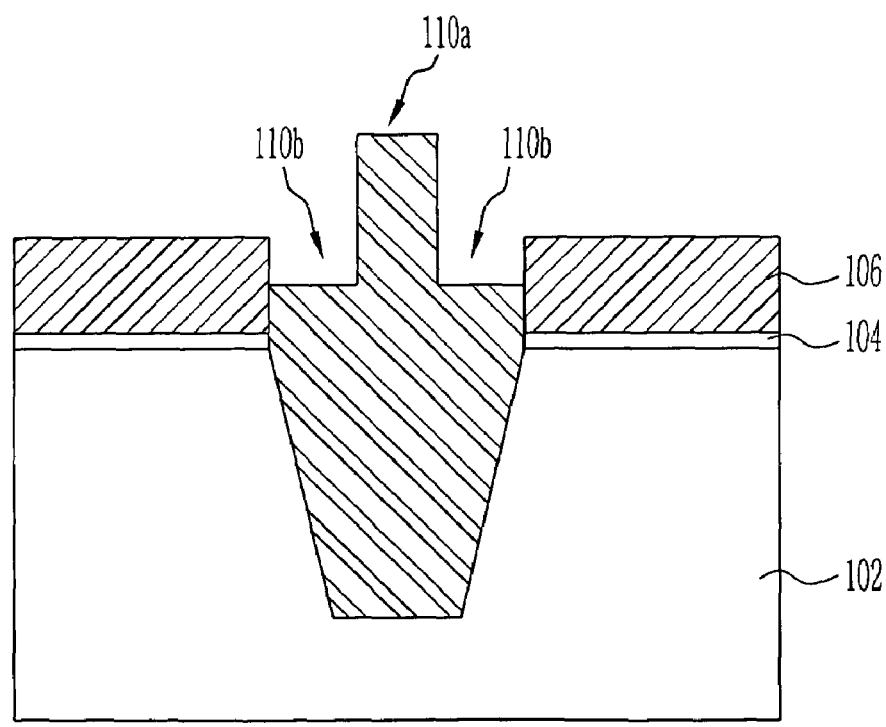

Turning to FIG. 4, a photoresist is coated on the entire structure. The exposure process and the development process using the photo mask are then sequentially implemented to form a photoresist pattern (not shown). Next, the HDP oxide film 110 is etched by means of a dry etch process using the photoresist pattern as an etch mask. Thereby, a protrusion 110a of a nipple shape having a profile in which the top of the HDP oxide film 110 is almost vertical. Grooves 110b serving like a given damascene pattern are also formed between the protrusion 110a and the first polysilicon film 106. As such, a moat phenomenon occurring at the top corner of the trench in a prior art could be prevented.

Figure 5:
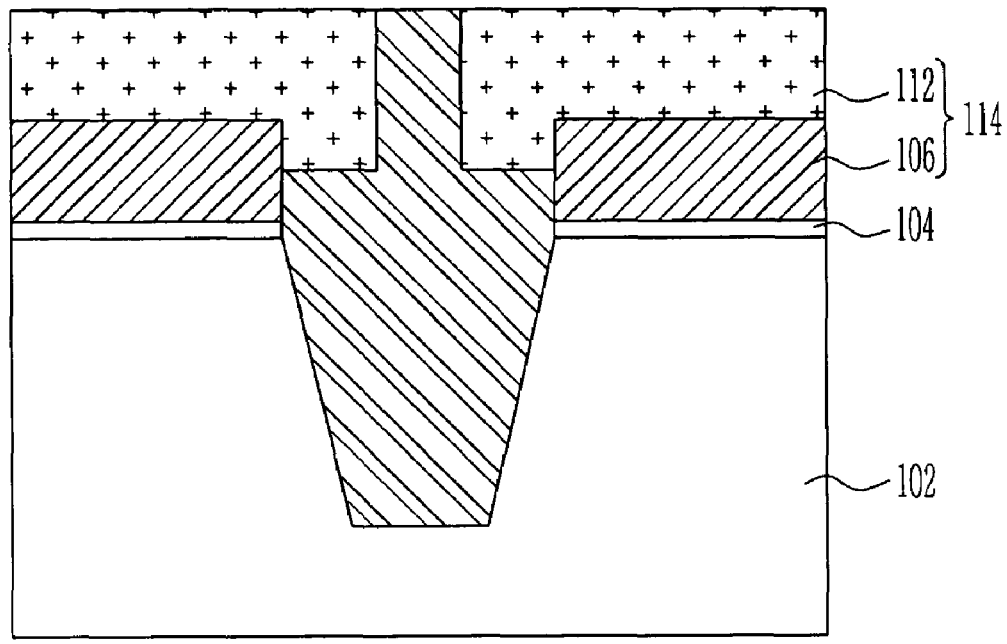

Referring to FIG. 5, a second polysilicon film 112 is deposited on the entire structure. At this time, the second polysilicon film 112 is formed using the same material to the first polysilicon film 106, wherein the second polysilicon film 112 is formed to bury the grooves 110b between the protrusion 110a and the first polysilicon film 106. The entire top surface is experienced by a CMP process. At this time, the CMP process is implementing to expose the top surface of the protrusion 110a of the HDP oxide film 110, so that the second polysilicon film 112 is polished. As such, a floating gate 114 consisting of the first and second polysilicon films 106 and 112 is formed.

Figure 6:
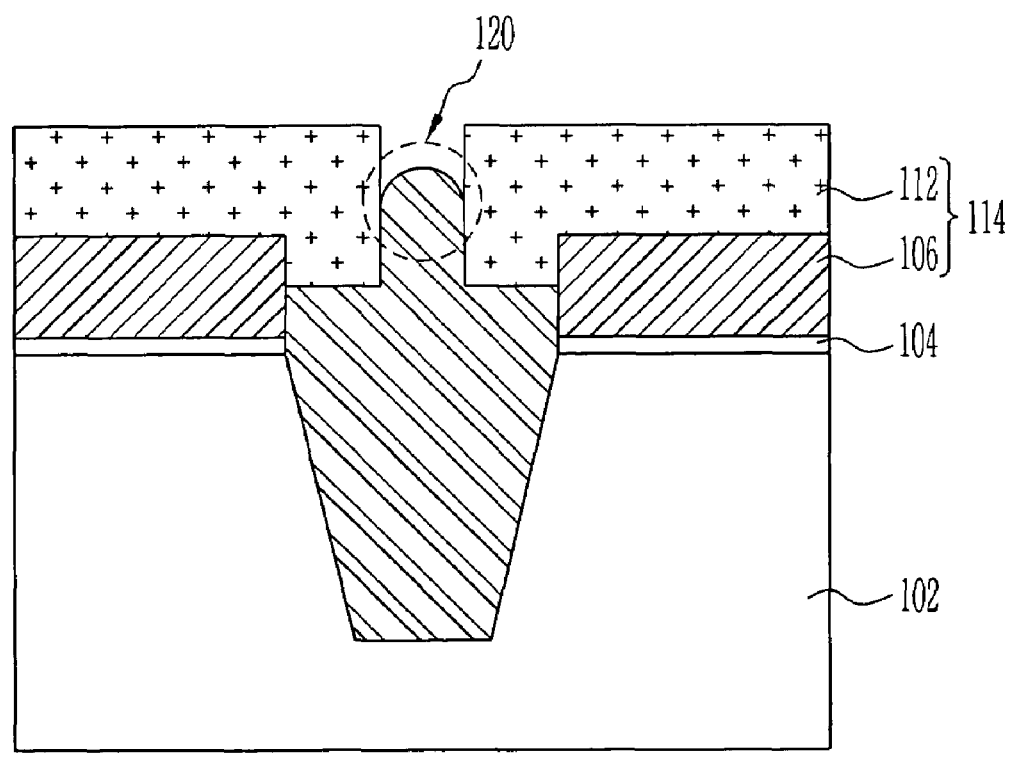

By reference to FIG. 6, the top surface of the protrusion 110a of the HDP oxide film 110 that is exposed, is isotropically etched by a pre-treatment cleaning process in a wet etch mode. Thereby, the protrusion 110a of the HDP oxide film 110 is etched to a given depth and the top of the protrusion 110a has a semicircle shape 120. In other words, the preferred embodiment of the present invention employs an isotropic characteristic of the wet etch mode in the pre-treatment cleaning process and the difference in the etch rate between the oxide film and the polysilicon film to form the isolation film the top of which has the semicircle shape.

A dielectric film (not shown) of an ONO (oxide film/nitride film/oxide film) structure and a control gate (not shown) are sequentially formed on the entire top surface. The dielectric film and the control gate may be formed using the same method to the prior art. Accordingly, explanation on them will be omitted for convenience of explanation.

As described above, according to the present invention, after the first polysilicon film is deposited on the semiconductor substrate, the trench is formed on the first polysilicon film with the pad nitride film not deposited. The HDP oxide film is then deposited to bury the trench. Next, the HDP oxide film is etched to define a portion where the second polysilicon film will be deposited in advance. The second polysilicon film is then deposited on the entire top surface, thus forming the floating gate. Therefore, the present invention has new effects that it can completely remove a moat and an affect on EFH (effective field oxide height), solve a wafer stress by simplified process and a nitride film, and effectively improve the coupling ratio of the flash memory device.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming a floating gate in a flash memory device, comprising the steps of:
    (a) forming a gate oxide film on a semiconductor substrate;
    (b) depositing a first polysilicon film on the gate oxide film;
    (c) etching portions of the first polysilicon film, the gate oxide film and the semiconductor substrate to form a trench;
    (d) depositing an oxide film for an isolation film on the entire top surface so that the trench is gap-filled and then implementing a polishing process;
    (e) implementing an etch process using a dry etch method to etch the oxide film for the isolation film, thus forming the oxide film having a protrusion of a vertical nipple shape; and
    (f) depositing a second polysilicon film on the entire top surface and then implementing a polishing process until a top surface of the protrusion is exposed so that a floating gate which consists of the first and the second polysilicon film is formed; and
    (g) implementing a pre-treatment cleaning process to form the top surface of the protrusion into a semicircle shape.

2. The method as claimed in claim 1, wherein the polishing process implemented in the step (d) employs a CMP method or an ACE method.

3. The method as claimed in claim 1, wherein the pre-treatment cleaning process is implemented in an isotropical wet etch mode.

* * * * *